(12) United States Patent
Bryant

(10) Patent No.: US 6,444,901 B1
(45) Date of Patent: Sep. 3, 2002

(54) ENCLOSURE FOR ELECTROMAGNETIC SEALING OF ELECTRICAL EQUIPMENT

(75) Inventor: Trevor J Bryant, Bulkington (GB)

(73) Assignee: Marconi Communications Limited, Coventry (GB)

( * ) Notice: Subject to any disclaimer, the term of this patent is extended or adjusted under 35 U.S.C. 154(b) by 0 days.

(21) Appl. No.: 09/602,190

(22) Filed: Jun. 12, 2000

(30) Foreign Application Priority Data

Jun. 11, 1999 (GB) .............................................. 9913660

(51) Int. Cl.$^7$ ................................................. H05K 9/00
(52) U.S. Cl. ....................... 174/35 R; 361/816; 361/818
(58) Field of Search ........................... 174/35 R, 35 GC; 361/753, 799, 800, 816, 818, 752, 796, 737, 740, 683, 684, 685, 686

(56) References Cited

U.S. PATENT DOCUMENTS

| | | | |
|---|---|---|---|
| 3,296,354 A | | 1/1967 | McAdams |
| 4,759,466 A | | 7/1988 | Chase et al. |
| 5,001,298 A | | 3/1991 | Jong |
| 5,008,487 A | | 4/1991 | Shimmyo |
| 5,175,395 A | * | 12/1992 | Moore ....................... 174/35 R |
| 5,348,549 A | * | 9/1994 | Brown et al. ................ 604/403 |
| 5,354,951 A | * | 10/1994 | Lange, Sr. et al. ......... 174/35 R |
| 5,783,771 A | * | 7/1998 | Copeland et al. .......... 174/35 R |
| 5,882,729 A | | 3/1999 | Kahl et al. |

FOREIGN PATENT DOCUMENTS

| | | |
|---|---|---|
| EP | 0 844 813 A2 | 5/1998 |
| GB | 2 236 910 A | 4/1991 |
| GB | 2 261 998 A | 6/1993 |

OTHER PUBLICATIONS

IBM Technical Disclosure Bulletin, vol. 33, No. 10B, Mar. 1991, *Integrated EMI Strip/Connection*, pp. 268–269.
IBM Technical Disclosure Bulletin, vol. 35, No. 4B, Sep. 1992, *EMI Gasket*, p. 315.

* cited by examiner

*Primary Examiner*—Dean A. Reichard
*Assistant Examiner*—Carmelo Oliva
(74) *Attorney, Agent, or Firm*—Kirschstein, et al.

(57) ABSTRACT

An improved electromagnetic seal is provided between body parts of an enclosure by providing mating surfaces of the body parts with projections to improve electrical contact between the body parts. The invention may be applied to various forms of mating surfaces, including complementary tongue and groove or stepped surfaces. Similar projections may also be introduced into slots for mounting of panels in order to improve electrical contact between the body parts and the panels.

11 Claims, 11 Drawing Sheets

US 6,444,901 B1

ENCLOSURE FOR ELECTROMAGNETIC SEALING OF ELECTRICAL EQUIPMENT

BACKGROUND OF THE INVENTION

The present invention relates to the field of enclosures for electrical or electronic equipment in general and to the electromagnetic sealing of such enclosures in particular.

Enclosures, both conductive (e.g. metal) and non-conductive (e.g. plastic) are used to house electrical and electronic equipment. Where electromagnetic compatibility (EMC) is a problem, e.g. either in the form of electromagnetic interference (EMI) from outside the enclosure affecting sensitive apparatus inside, or vice versa, measures are taken to make the enclosure an effective electromagnetic (EM) screen.

Metal enclosures are obviously to be preferred from an EMC point of view, although cost, aesthetic and other factors mean that plastic enclosures are often used. In order to offer EM screening, plastic enclosures are coated with a conductive skin (e.g. metallic paint) or, alternatively, conductive, metal loaded plastic may be used. These enclosures are typically assembled from two matching halves mated together. Despite the use of conductive materials, EM leakage may occur at the join between the two halves. A known method to reduce EM leakage at the join is to insert a soft, metalised gasket along the join. A complementary measure is to include frequent fixing points (i.e. for fixing the two halves together) around the enclosure in the vicinity of the join to counteract the tendency of the join to open at sections away from the fixing points.

The introduction of extra fixing points leads to increased complexity of the mould or the machining and increased assembly time. The use of gaskets increases cost and assembly time.

Another means to improve EM screening is to create a tongue and groove joint between the two halves. A continuous groove is moulded or machined into the mating surface of one half of the enclosure and a complementary tongue (or wall) is moulded or machined on the corresponding mating surface of the other half. Disassembly is a particular problem where metallic coatings such as metallic paint are applied to the tongue and groove. In order to ensure ease of disassembly, the fit between the tongue and groove is designed to be generous.

However, this generous fit leads to poor electrical contact being obtained between the mating surfaces resulting in gaps in the EM seal which allow the passage of unwanted EM radiation.

SUMMARY OF THE INVENTION

Use of the present invention provides good EM sealing of enclosures with low cost and easy assembly.

The present invention provides an enclosure for electrical or electronic equipment comprising a first and a second electrically conductive body part, the first and second body parts each comprising a mating surface for mating with the mating surface of the other body part on assembly in which at least one of the mating surfaces comprises a plurality of electrically conductive projections for contacting the other mating surface when assembled; in which the mating surfaces are disposed at the periphery of the relevant body part, in which the plurality of projections are dispersed along the periphery, and in which each projection is substantially electro-magnetically shielded by at least one of the body parts when assembled; in which the electromagnetic shielding comprises portions of the first and second body parts which overlap each other when assembled; in which the electromagnetic shielding comprises a tongue on one mating surface and a groove on the other mating surface.

In a further preferred embodiment the invention provides an enclosure comprising a panel groove for mounting a panel, in which the panel groove comprises one or more electrically conductive projections on the groove surface for contacting the panel when assembled.

BRIEF DESCRIPTION OF THE DRAWINGS

Embodiments of the present invention will now be described by way of example with reference to the drawings in which.

All drawings are to scale, although the present invention is not limited to the specific size ratios illustrated therein.

DETAILED DESCRIPTION OF THE PREFERRED EMBODIMENTS

Figure 1:
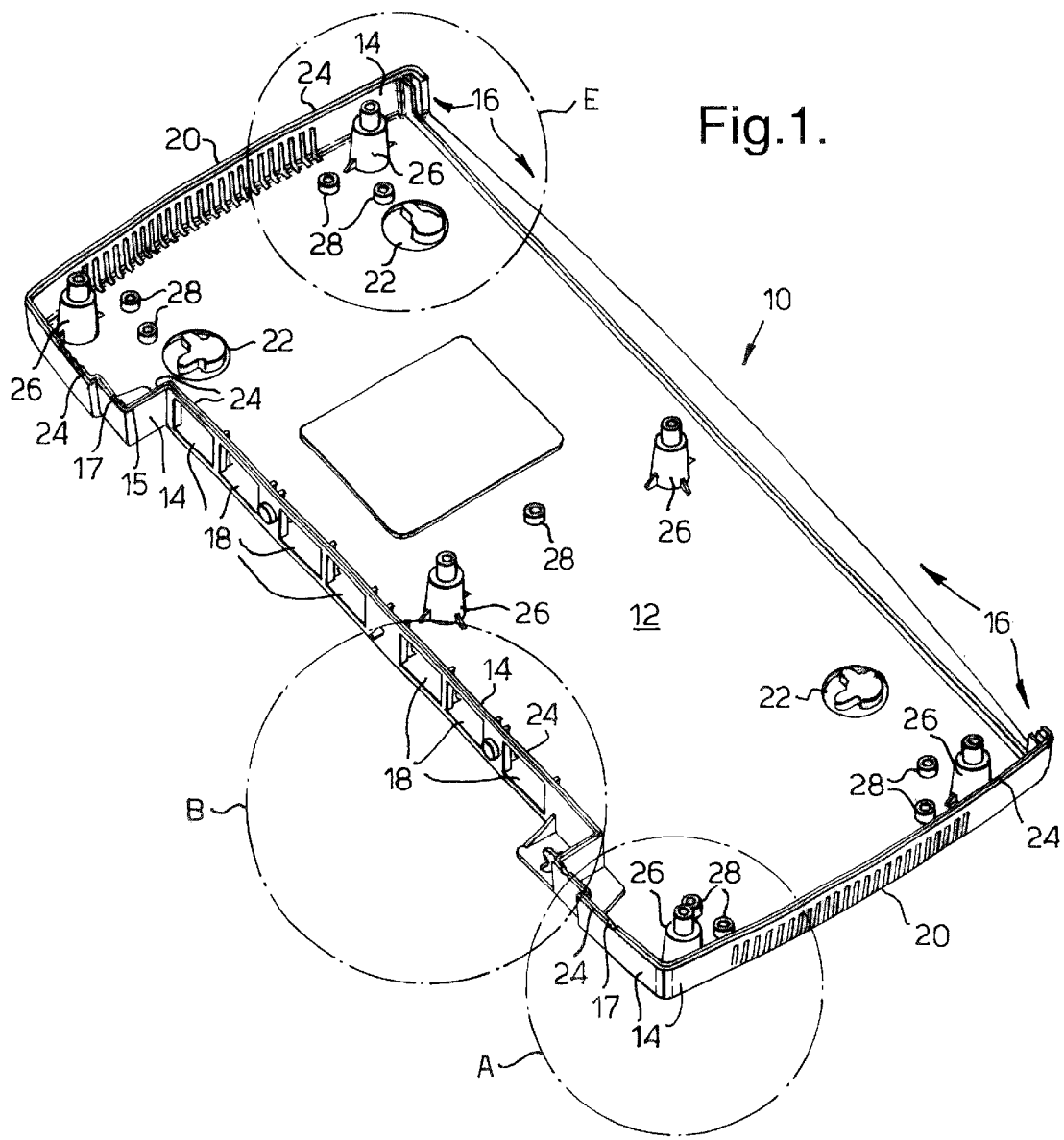
FIGS. 1 and 2 show first and second halves of an enclosure according to the present invention.
Figure 2:
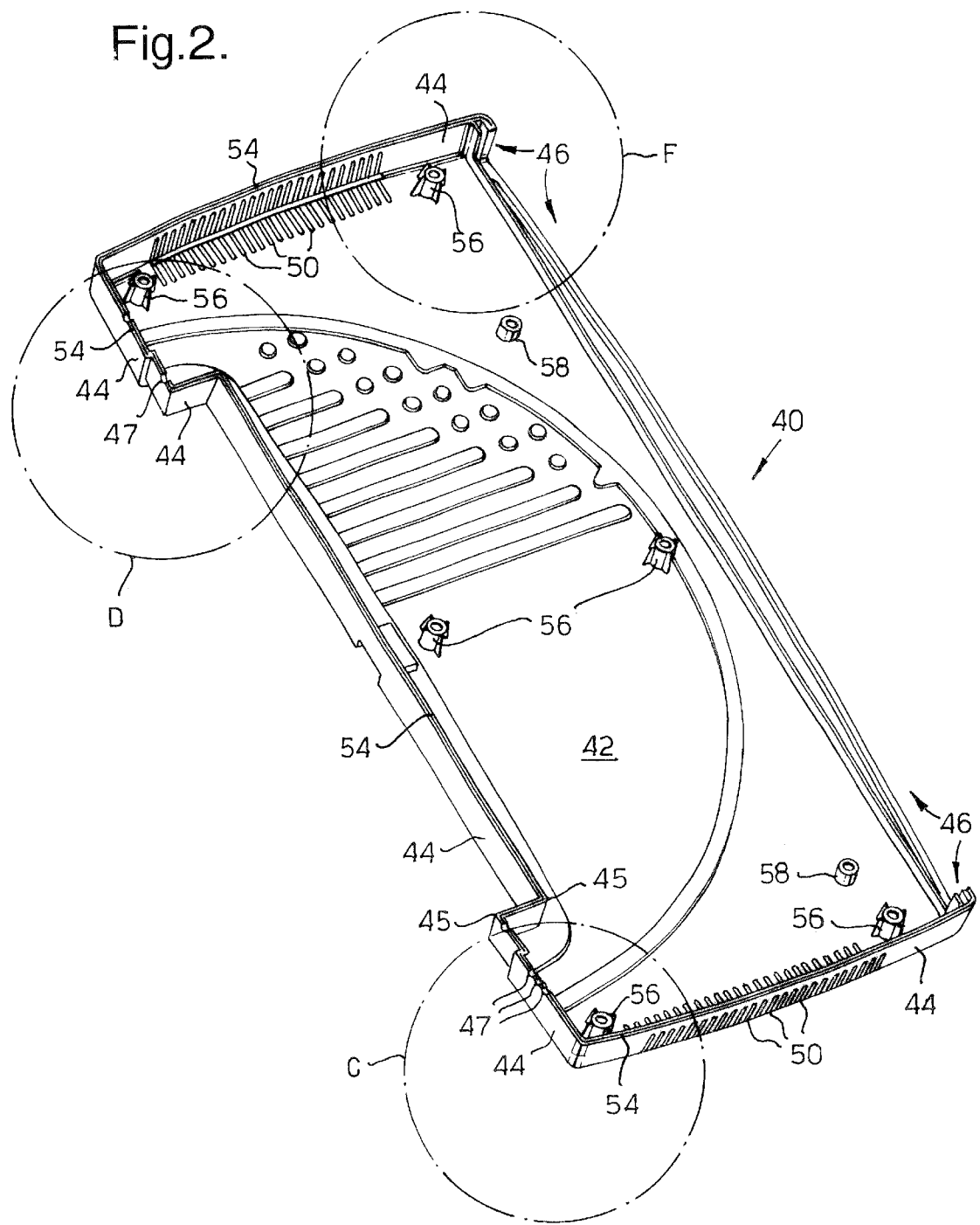

FIGS. 1 and 2 show two mating halves of an enclosure according to a first embodiment of the present invention. FIG. 1 shows one half 10 of the enclosure comprising base 12 and peripheral wall 14. Peripheral wall 14 is provided with gap 16 for mounting a panel, eg for presenting switches and indicators to the user and indentations or "cut-outs" 17 which introduce gaps in the top surface 15 of wall 14. Wall 14 also comprises a number of holes 18 for mounting connectors, switches, etc. In addition a plurality of slots 20 are provided for ventilation and protrusions 22 are provided for mounting the enclosure, eg on the wall of a room. The top surface 15 of wall 14 (the "mating surface") is provided with a tongue 24 which may be continuous or divided (as shown in the figure) into a number of sections for ease of manufacture (eg at some corners) or due to gaps 16, 17 in the top surface 15 of wall 14. Plurality of bosses 26 are incorporated in the base 12 for co-operating with corresponding bosses 46 of the second part (see FIG. 2) for fixing the two halves together. In addition, supplementary bosses 28 are provided for mounting equipment, eg printed circuit boards inside the enclosure.

FIG. 2 shows the second, mating half 40 of the enclosure of the first embodiment comprising base 42 and peripheral wall 44. Peripheral wall 44 is provided with gap 46 for mounting a panel in co-operation with gap 16 in peripheral wall 14 of fist half 10 and indentations or "cut-outs" 47 which introduce gaps into the top surface 45 (the "mating surface") of wall 44. Wall 44 also comprises a plurality of slots 50 for ventilation. The top surface 45 of wall 44 is provided with a groove 54 which may be continuous or divided (as shown in the figure) into a number of sections for ease of manufacture or due to gaps 46, 47 in the top surface 45. A plurality of bosses 56 are incorporated into base 42 for co-operating with bosses 26 of first half 10. In addition, supplementary bosses 58 are provided for mounting equipment, eg printed circuit boards inside the enclosure.

Tongue 24 and groove 54 are arranged to co-operate on assembly of the two halves of the enclosure such that tongue 24 is at least partially accommodated in groove 54.

For the purpose of clarity the term "height" in relation to a tongue or groove refers to that dimension substantially at right angles to the mating surface 15, 45 on which or in which the tongue or groove extends and the term "width" refers to a dimension through the tongue or across the groove substantially parallel to the relevant mating surface 15, 45. The term "height" in relation to a projection refers to the dimension substantially at right angles to the surface (eg. of a tongue or a groove) from which it projects. A projection projecting from more than one surface may have a different height from each such surface.

Figure 3:
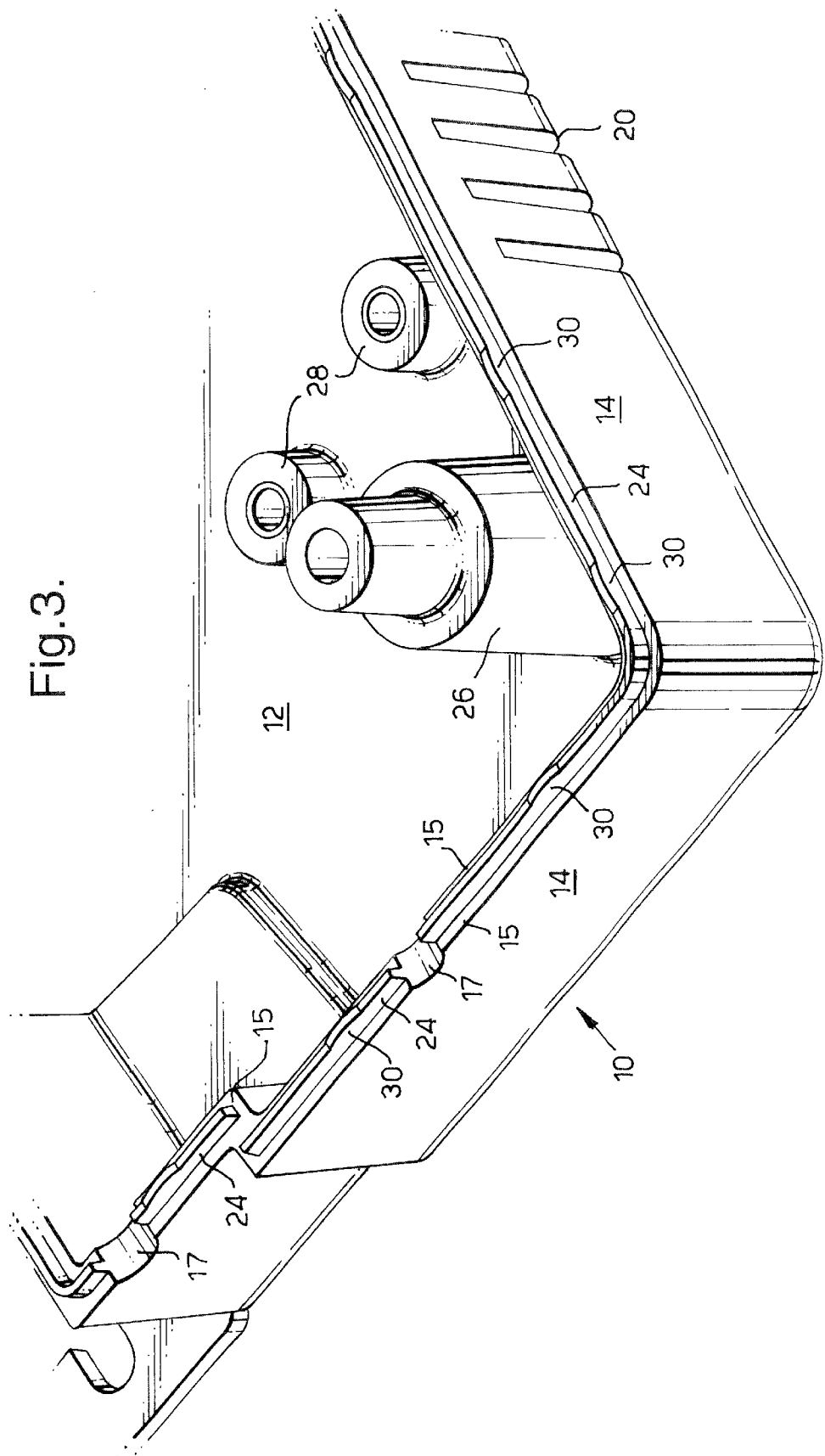
FIGS. 3 to 13 show parts of the enclosure of FIGS. 1 and 2 according to the present invention in more detail.

FIG. 3 shows area A of the enclosure half 10 of FIG. 1 at larger scale with the tongue 24 shown in more detail. Other elements of the enclosure half 10 already described in relation to FIG. 1 are given the same reference numerals and will not be described further. As shown in FIG. 3, wall 24 is provided with a plurality of projections 30 on the top surface thereof. According to further embodiments, similar projections (60, see FIG. 11) are provided on the lower surface of co-operating groove 54 either in addition to or instead of the projections 30. The projections function, whether on the surface of the tongue or of the groove or of both, to improve mechanical contact between the two halves 10, 40 of the assembled enclosure. Where the tongue and groove are conductive or covered with a conductive skin the improved mechanical contact results in improved electrical contact between the two halves at the projections and helps to improve EM screening. Although shown having a rounded profile, various alternative shapes of the projections including rectangular, triangular or ridged/grooved may be used according to the present invention, depending on factors such as material used.

Figure 4:
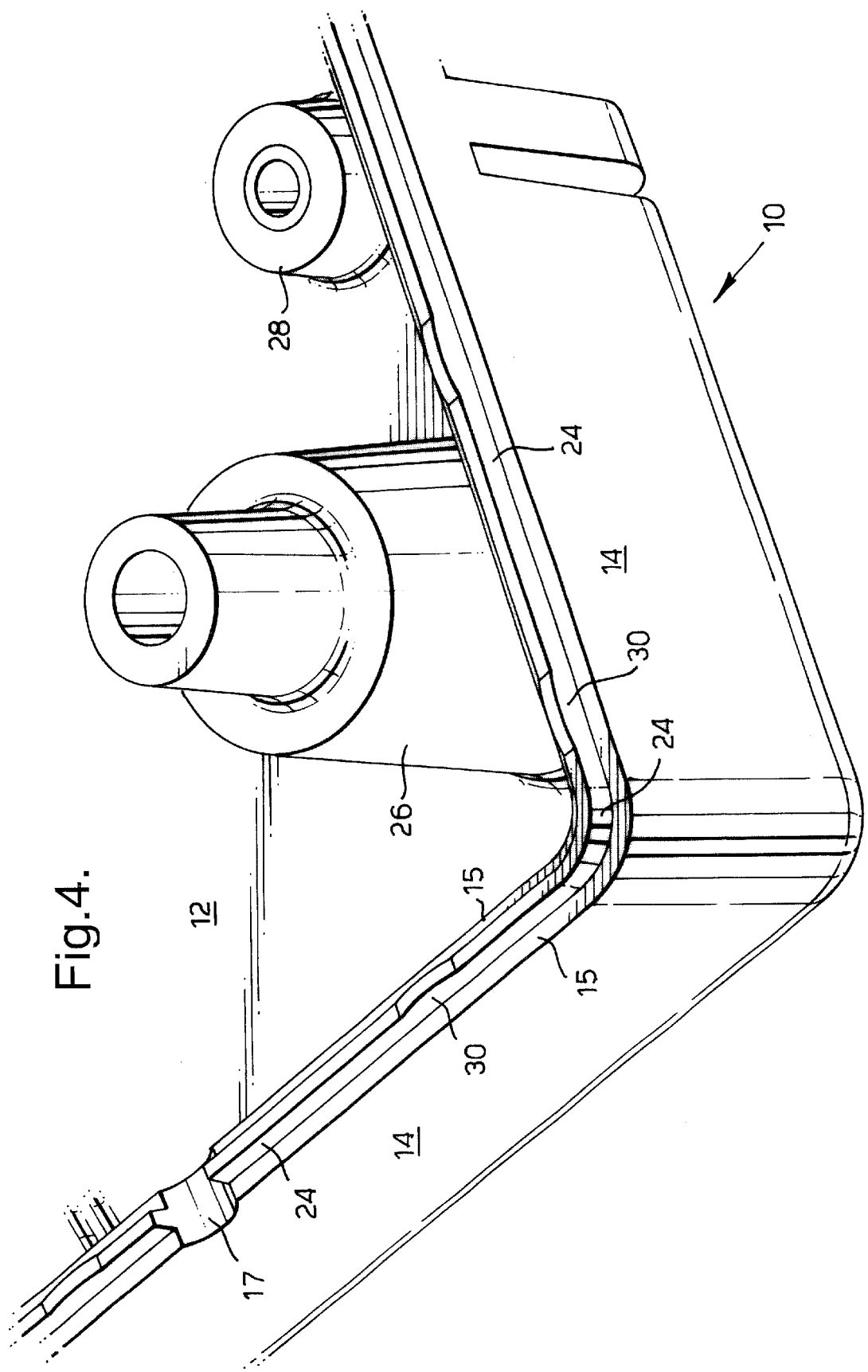
Figure 5:
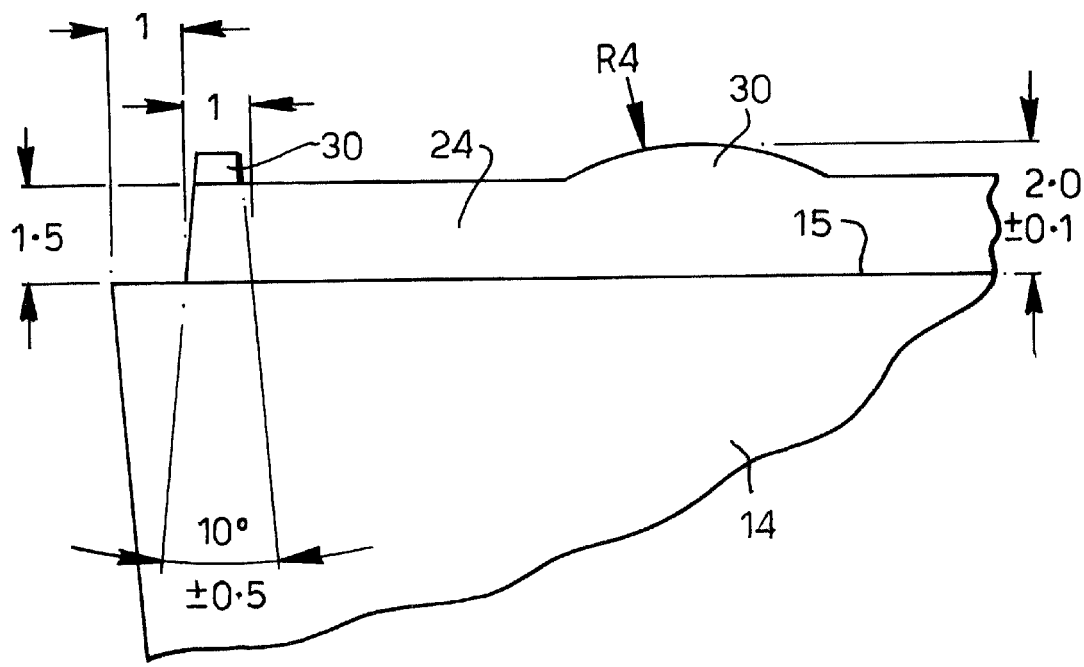

FIGS. 4 and 5 show part of FIG. 3 at successively larger scales. Features common to FIG. 3 are given the same reference numerals and are not described further.

FIG. 5 in particular shows an elevation of the enclosure half 10 of FIG. 3 with suitable dimensions of key features for an enclosure moulded from Acrylonitrile Butadiene Styrene (ABS). As shown in FIG. 5, by way of example, tongue 24 has a height of 1.5 mm above the mating surface 15 of wall 14, and a width of 1.0 mm at the base (i.e. where it meets the mating surface 15) tapering at an angle of 10° plus/minus 0.5° away from the mating surface 15. Projection 30 is shown as a curve projecting a further 0.5 mm above the top surface of tongue 24 (i.e. extending 2.0 mm plus/minus 0.1 mm in total from the mating surface 15), with the curve having a radius of 4.0 mm.

According to a further embodiment of the present invention, the height of the projections 30, 60 whether on the surface of the tongue 24 or groove 54, are varied according to their position around the join between the two halves 10, 40 of the enclosure. The height of projections 30, 60 increases with increased distance from the nearest fixing point (i.e. boss 26 or 56) so that the tendency of the join to gape open midway between fixing points 26 and 56 is compensated for by the varying height of projections 30, 60 and so that good electrical contact is achieved at all projections 30, 60 irrespective of position around the join. Advantageously, this reduces the number of fixing points required.

Figure 6:
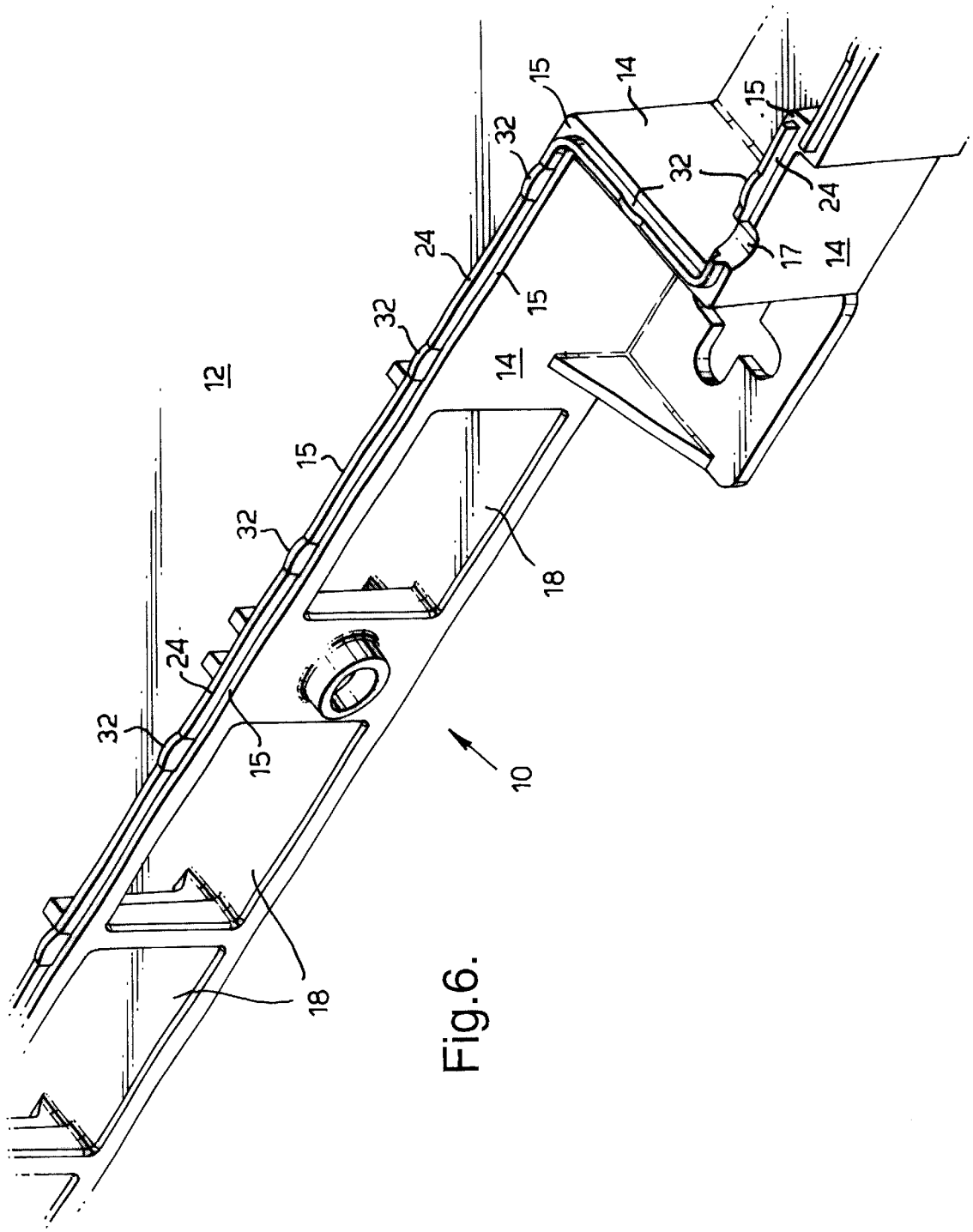

FIG. 6 shows area B of the enclosure half 10 of FIG. 1 at larger scale with the tongue 24 shown in more detail. Other elements of the enclosure half 10 already described in relation to FIG. 1 are given the same reference numerals and will not be described further. As shown in FIG. 6, wall 24 is provided with a plurality of second projections 32. Unlike projections 30, 60 described above, the projections 32 of FIG. 6 project from the top and side surfaces of wall 24. According to further embodiments of the present invention, similar projections (not shown) are provided on the lower and side surfaces of co-operating groove 54 (i.e. forming a 'U' shaped projection inside groove 54) either in addition to or instead of the projections 32 on tongue 24. As with projections 30, 60 projections 32 function, whether on the surfaces of the tongue or of the groove or of both, to improve mechanical contact and, hence, electrical contact between the two halves 10, 40 of the assembled enclosure.

According to a further embodiment the height of the projections 32 from the top surface of the tongue or the bottom surface of the groove are varied according to their position around the join between the two halves 10, 40 of the enclosure. Thus the height of these projections increase with increased distance from the nearest fixing point (i.e. boss 26 or 56) to compensate for the tendency of the join to gape open midway between fixing points 26 or 56.

Advantageously, for moulded parts, adjustment of the heights of projections may be achieved by a "metal off" process whereby height of a projection may be increased as necessary by removing material (typically metal) from the mould. This allows fine adjustments to be made at a late stage in preparations for manufacture.

Figure 7:
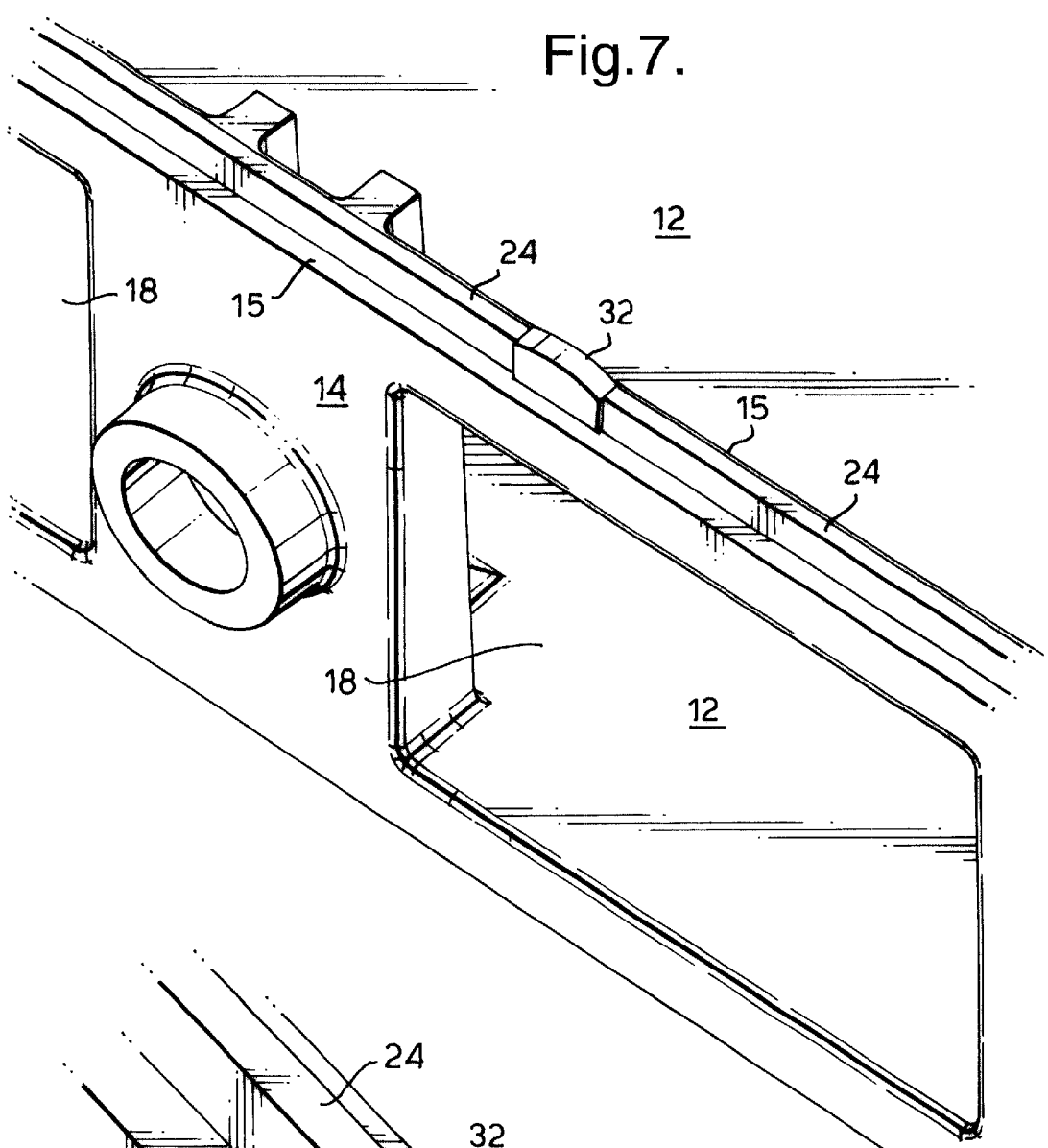
Figure 8:
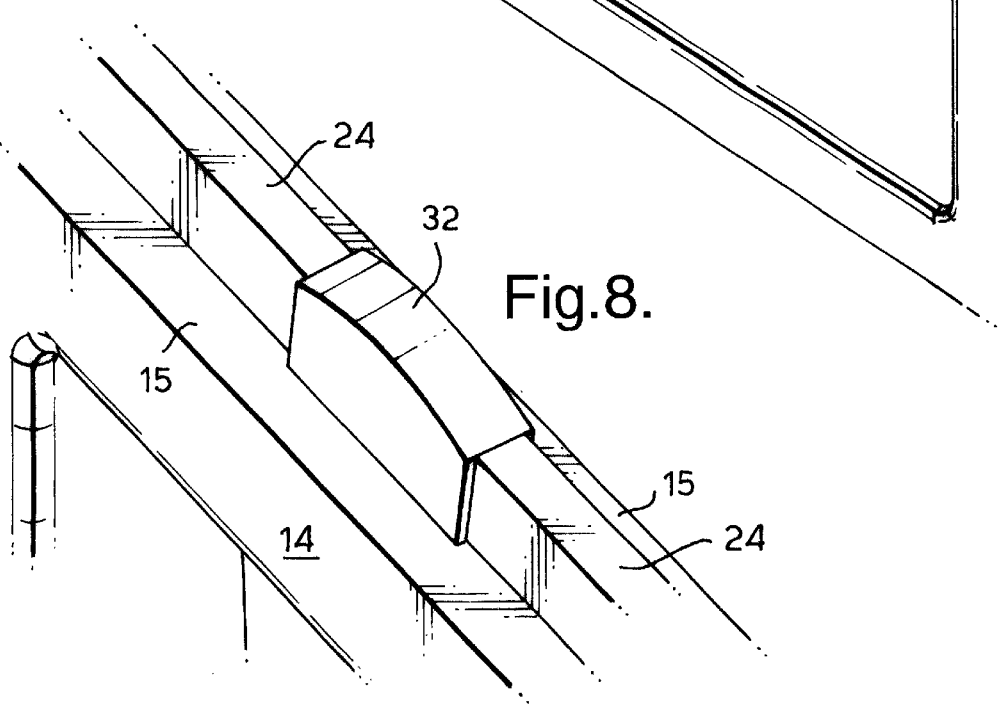

FIGS. 7 and 8 show part of FIG. 6 at successively larger scales to more clearly show projection 32 on tongue 24. Features common to FIG. 6 are given the same reference numerals and are not described further.

Figure 9:
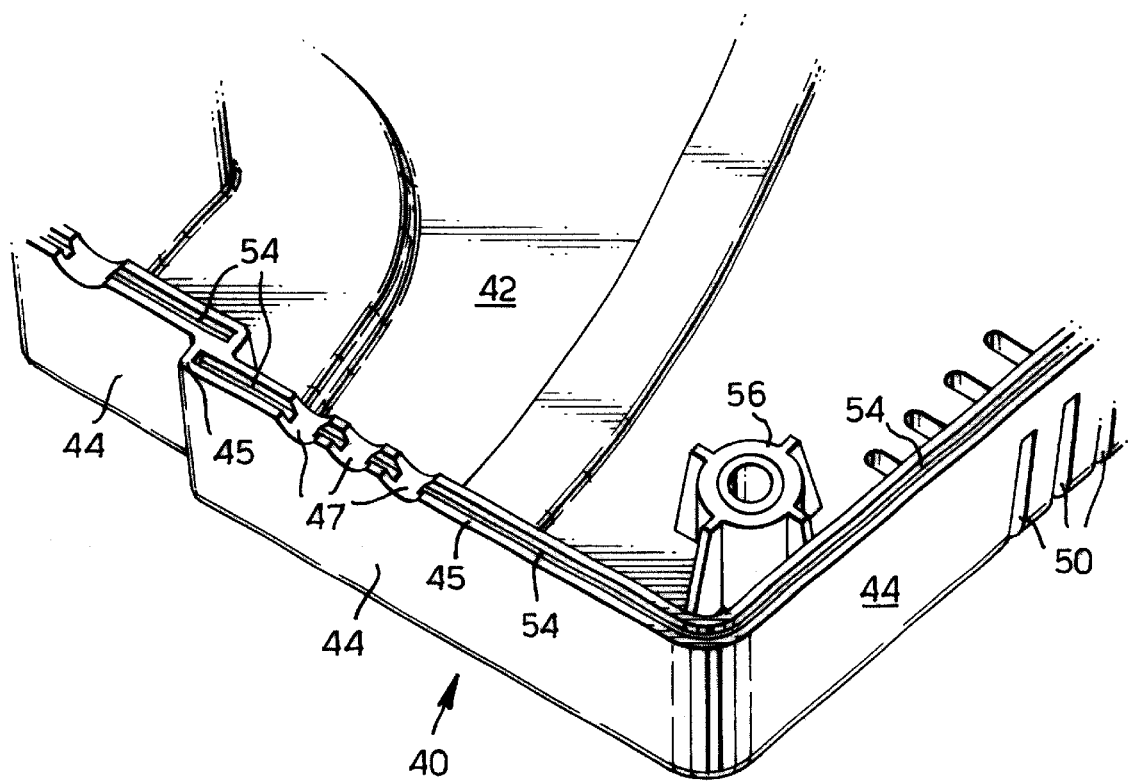
Figure 10:
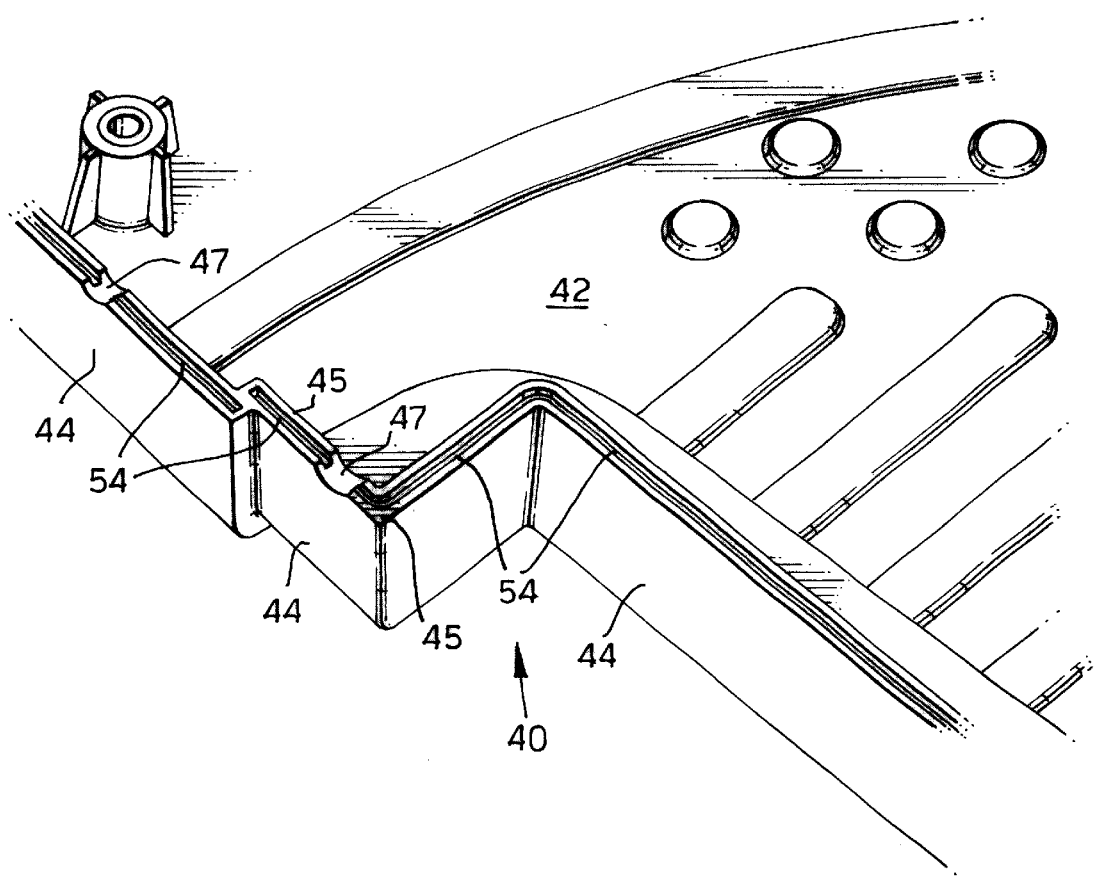

FIGS. 9 and 10 show parts C and D respectively of the enclosure half 40 of FIG. 2 at larger scale. In particular, FIGS. 9 and 10 show groove 54 in mating surface 45 of wall 44 comprised of several parts separated at gaps (i.e. indentations 47 in mating surface 45 of wall 44) and at some corners. Other features common to earlier figures described above are given the same reference numerals as in the earlier figures and are not described further.

Although the groove 54 of FIGS. 9 and 10 is shown without projections, such projections may be present according to embodiments of the present invention, as described above.

Figure 11:
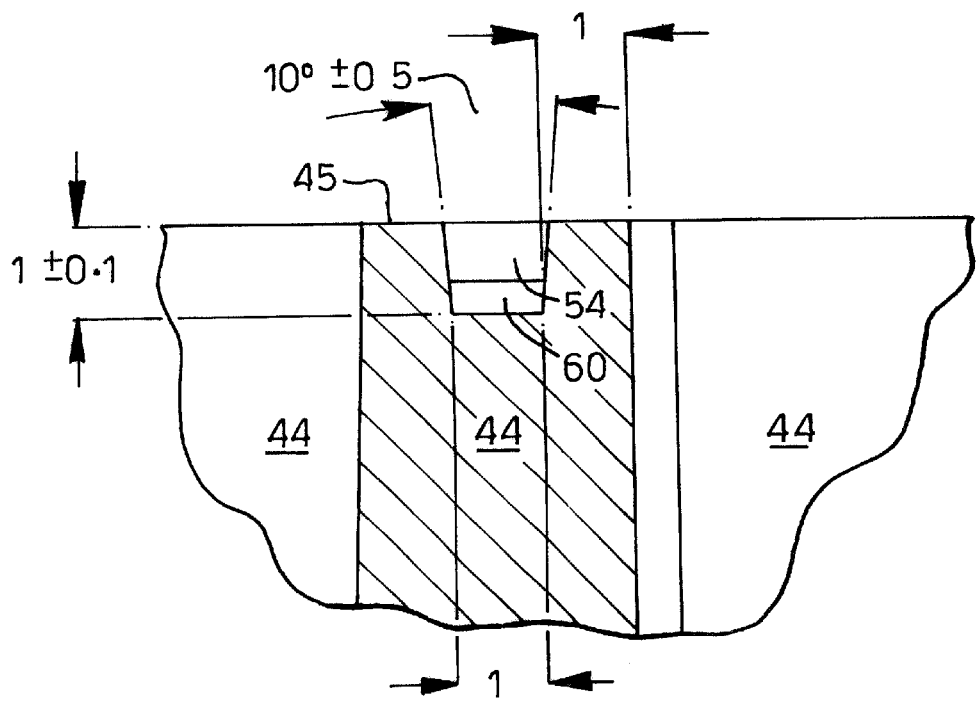

FIG. 11 shows a cross-section of part of the enclosure half 40 of FIG. 10 with suitable dimensions of key features for an enclosure moulded from ABS. As shown in FIG. 11, by way of example, groove 54 has a depth of 1.0 mm plus/minus 0.1 mm and a width of 1.0 mm at the top of the groove (i.e. where it meets the mating surface 45 of wall 44), tapering at an angle of 10° plus/minus 0.5° away from the mating surface 45.

Figure 12:
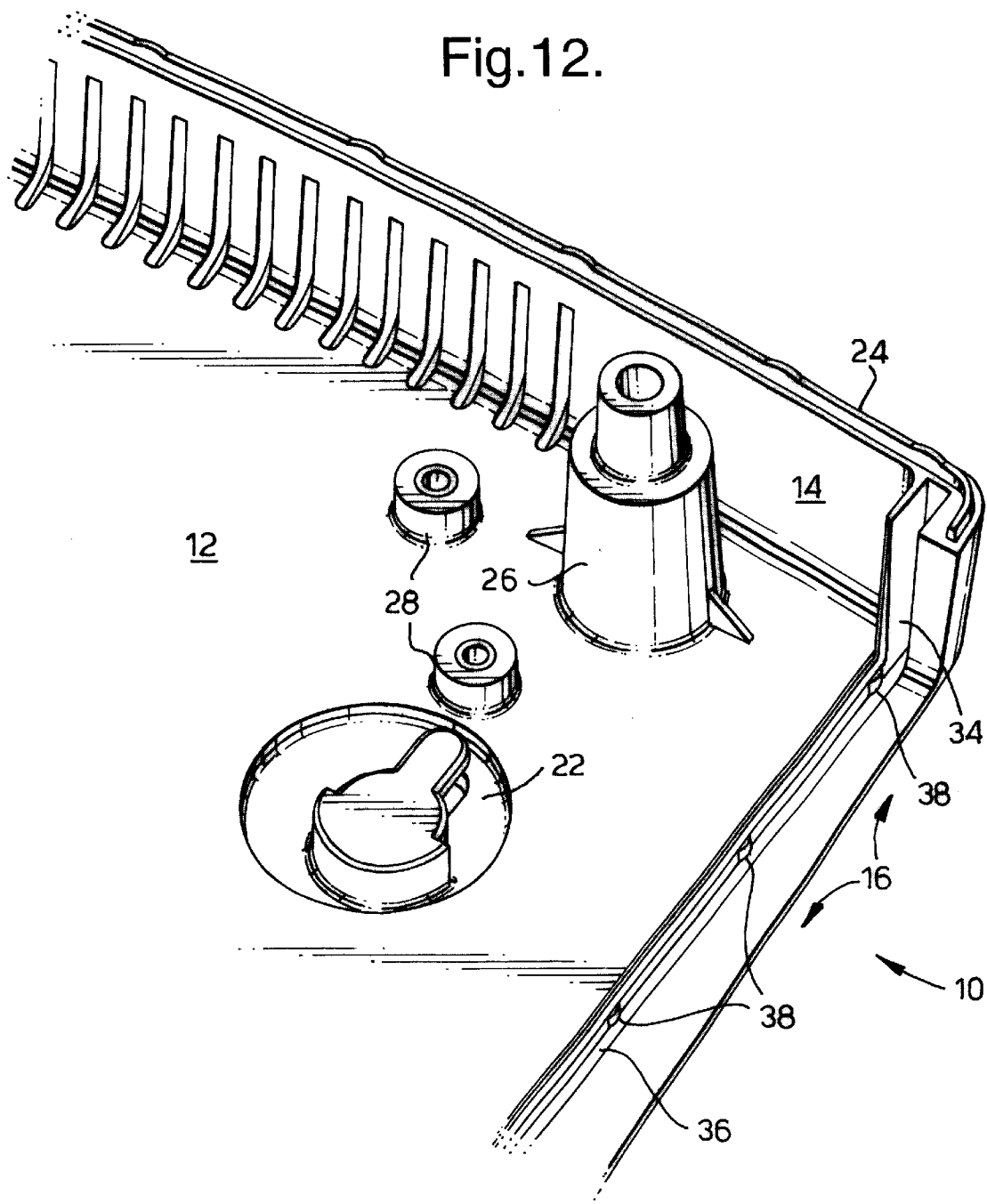
Figure 13:
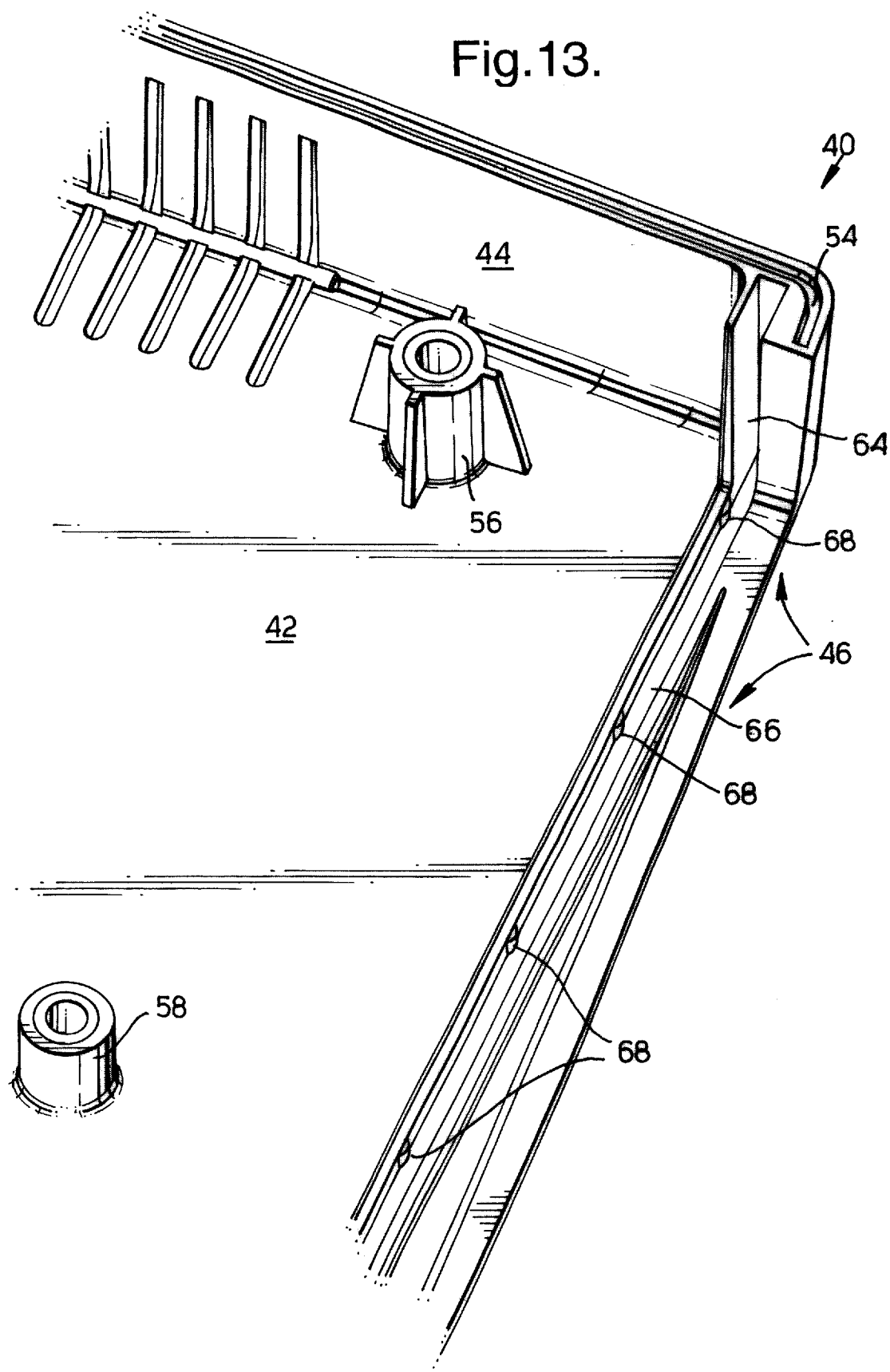

FIGS. 12 and 13 show parts E and F of the enclosure halves 10 and 40 of FIGS. 1 and 2 respectively at larger scale and showing the corresponding gaps 16, 46 in walls 14, 44 respectively for mounting a panel (not shown). As shown in FIG. 12, gap 16 is bordered by panel grooves 34 (one shown) which are formed in each end of wall 14 (one shown), one at either end of gap 16. Panel grooves 34 open into and are linked by further panel groove 36 which is formed in base 12 of enclosure half 10. According to an alternative embodiment, gap 16 is formed by a section (not shown) of wall 14 of reduced height and panel groove 36 is formed in the top surface of the reduced height section of wall 14. This embodiment advantageously allows for accommodating smaller panels.

As shown in FIG. 13, gap 46 is bordered by panel grooves 64 (one shown) which are formed in each end of wall 44 (one shown), one at either end of gap 46. Panel grooves 64 open into and are linked by further panel groove 66 which is formed in base 42 of enclosure half 40. According to an alternative embodiment, gap 46 is formed by a section (not shown) of wall 44 of reduced height and panel groove 66 is formed in the top surface of the reduced height section of wall 44. This embodiment advantageously allows for accommodating smaller panels.

FIGS. 12 and 13 also show projections 38, 68 in one side wall of panel grooves 36, 66 respectively. According to further embodiments (not shown), similar projections may be provided on the bottom faces of the panel grooves 36, 66 or on the faces opposite to the ones shown in FIGS. 12 and 13 in combination with or in place of the projections 38, 68 shown.

According to further embodiments (not shown), similar projections may be provided on one or more faces of panel grooves 34, 64 either in addition to or in place of the projections described above with reference to panel grooves 36, 66.

According to a further preferred embodiment, the projections are distributed around the join substantially equally spaced with the maximum spacing between two adjacent projections being determined by the minimum wavelength of radiation it is desired to screen.

Although described above in relation to an enclosure consisting of two body parts, the present invention is equally applicable to enclosures with a greater number of body parts. The tongue and groove are used due to the EM shielding they provide, i.e. in preventing a clear, straight path for radiation to cross the join.

I claim:

1. An enclosure for electrical or electronic equipment, comprising: a first and a second electrically conductive body part, the first and second body parts each comprising a mating surface for mating with a mating surface of the other body part on assembly in which at least one of the mating surfaces comprises a plurality of electrically conductive projections for contacting the other of the mating surfaces when assembled, the mating surfaces being disposed at a periphery of the respective body part, the plurality of projections being dispersed along the periphery, each projection being substantially shielded by an electromagnetic shielding by at least one of the body parts when assembled, the electromagnetic shielding comprising portions of the first and second body parts which overlap each other when assembled, the electromagnetic shielding comprising a tongue on one of the mating surfaces and a groove on the other of the mating surfaces, and a plurality of fixing points in which the projections have heights that increase with distance from the nearest fixing point.

2. The enclosure of claim 1, in which the projections project from one of a top surface of the tongue and a bottom surface of the groove.

3. The enclosure of claim 2, in which the projections project from both the top surface of the tongue and the bottom surface of the groove.

4. The enclosure of claim 1, in which the projections project from one of a side surface of the tongue and a side surface of the groove.

5. The enclosure of claim 4, in which the projections project from one of both side surfaces of the tongue and both side surfaces of the groove.

6. The enclosure of claim 1, and further comprising a panel groove for mounting a panel, in which the panel groove comprises one or more electrically conductive projections on a surface of the panel groove for contacting the panel when assembled.

7. The enclosure of claim 6, in which the projections project from a bottom surface of the panel groove.

8. The enclosure of claim 1, in which the projections project from one side surface of the groove.

9. The enclosure of claim 8, in which the projections project from both side surfaces of the groove.

10. An enclosure for electrical or electronic equipment, comprising: a first and a second electrically conductive body part, the first and second body parts each comprising a mating surface for mating with a mating surface of the other body part on assembly in which at least one of tie mating surfaces comprises a plurality of electrically conductive projections for contacting the other of the mating surfaces when assembled. the mating surfaces being disposed at a periphery of the respective body part, the plurality of projections being dispersed along the periphery, each projection being substantially shielded by an electromagnetic shielding by at least one of the body parts when assembled, the electromagnetic shielding comprising portions of the first and second body parts which overlap each other when assembled, the electromagnetic shielding comprising a tongue on one of the mating surfaces and a groove on the other of the mating surfaces, the tongue comprising one or more of the electrically conductive projections on a surface of the tongue for contacting the groove when assembled, and the groove comprising one or more of the electrically conductive projections on a surface of the groove for contacting the tongue when assembled.

11. An enclosure for electrical or electronic equipment, comprising: a first and a second electrically conductive body part, the first and second body parts each comprising a mating surface for mating with a mating surface of the other body part on assembly in which at least one of the mating surfaces comprises a plurality of electrically conductive projections for contacting the other of the mating surfaces when assembled, the mating surfaces being disposed at a periphery of the respective body part, the plurality of projections being dispersed along the periphery, each projection being substantially shielded by an electromagnetic shielding by at least one of the body parts when assembled, the electromagnetic shielding comprising portions of the first and second body parts which overlap each other when assembled, the electromagnetic shielding comprising a tongue on one of the mating surfaces and a groove on the other of the mating surfaces, the projections projecting from both a top surface of the tongue and a bottom surface of the groove.

* * * * *